(12) United States Patent
Jung et al.

(10) Patent No.: US 9,287,334 B2
(45) Date of Patent: Mar. 15, 2016

(54) ORGANIC LIGHT EMITTING DIODE DISPLAY

(71) Applicant: SAMSUNG DISPLAY CO., LTD., Yongin, Gyeonggi-Do (KR)

(72) Inventors: Kyu-Ho Jung, Yongin (KR); Sang-Hee Choi, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 268 days.

(21) Appl. No.: 14/102,824

(22) Filed: Dec. 11, 2013

(65) Prior Publication Data

US 2014/0167010 A1   Jun. 19, 2014

(30) Foreign Application Priority Data

Dec. 13, 2012   (KR) .......................... 10-2012-0145607

(51) Int. Cl.
| | | |
|---|---|---|
| *H01L 27/32* | (2006.01) | |
| *H01L 51/52* | (2006.01) | |
| *G06F 1/16* | (2006.01) | |
| *G06F 3/041* | (2006.01) | |

(52) U.S. Cl.
CPC ............ *H01L 27/323* (2013.01); *G06F 1/1626* (2013.01); *G06F 3/041* (2013.01); *H01L 27/3276* (2013.01); *H01L 51/5246* (2013.01)

(58) Field of Classification Search
CPC .............. H01L 27/323; H01L 27/3276; H01L 51/5246; G06F 3/047; G06F 3/00; G06F 3/0412

See application file for complete search history.

(56) References Cited

U.S. PATENT DOCUMENTS

| | | | | |
|---|---|---|---|---|
| 2009/0174679 A1* | 7/2009 | Westerman | ......... | G06F 3/03547 345/173 |
| 2010/0295797 A1* | 11/2010 | Nicholson | ............. | G06F 1/1626 345/173 |
| 2012/0227259 A1* | 9/2012 | Badaye | .................. | G06F 3/044 29/846 |

FOREIGN PATENT DOCUMENTS

| | | |
|---|---|---|
| KR | 10-0251094 B1 | 1/2000 |
| KR | 10-2010-0004292 A | 1/2010 |
| KR | 10-2011-0124534 A | 11/2011 |
| KR | 10-2013-0131010 A | 12/2013 |

* cited by examiner

*Primary Examiner* — Anne Hines
(74) *Attorney, Agent, or Firm* — Lee & Morse, P.C.

(57) ABSTRACT

An organic light emitting diode display includes a display panel including a display area to which a touch screen panel is attached and a pad area in which a metal wire is formed; a cover window on one side of the display panel; a resin layer between the display panel and the cover window; and a touch screen circuit film in the pad area and connected to the touch screen panel, at least one of the touch screen circuit film and the metal wire including an ultraviolet ray transmitter configured to increase a hardening degree of the resin layer in the pad area.

17 Claims, 11 Drawing Sheets

ORGANIC LIGHT EMITTING DIODE DISPLAY

CROSS-REFERENCE TO RELATED APPLICATION

This application claims priority to and the benefit of Korean Patent Application No. 10-2012-0145607, filed in the Korean Intellectual Property Office on Dec. 13, 2012, and entitled: "ORGANIC LIGHT EMITTING DIODE DISPLAY," which is incorporated by reference herein in its entirety.

BACKGROUND

1. Field

Embodiments relate to an organic light emitting diode (OLED) display.

2. Description of the Related Art

An organic light emitting display may include an organic light emitting device having an organic light emitting layer. The organic light emitting display is a self-emitting type display that generates light as excitons, which are generated by combination of holes (injected in the hole injection electrode) and electrons (injected in the electron injection electrode) in the organic light emitting layer, fall from an exited state to a ground state. The organic light emitting display does not need a separate light source. As such, the organic light emitting display may be operated in a low voltage and formed in a light, thin form, and is attracting attention as a next-generation display due to high quality properties such as a wide vision angle, a high contrast, a high response speed, etc.

The above information disclosed in this Background section is only for enhancement of understanding of the background of the described technology and therefore it may contain information that does not form the prior art that is already known in this country to a person of ordinary skill in the art.

SUMMARY

Embodiments are directed to an organic light emitting diode display, including a display panel including a display area to which a touch screen panel is attached and a pad area in which a metal wire is formed, a cover window on one side of the display panel, a resin layer between the display panel and the cover window, and a touch screen circuit film in the pad area and connected to the touch screen panel, at least one of the touch screen circuit film and the metal wire including an ultraviolet ray transmitter configured to increase a hardening degree of the resin layer in the pad area.

The touch screen circuit film may include a base film, a wire circuit on one side of the base film, and a solder resist covering a part of the wire circuit, the touch screen circuit film including the ultraviolet ray transmitter.

The ultraviolet ray transmitter may include a plurality of through holes formed in the base film.

The through holes may be formed in a part of the base film that is not covered by the solder resist, the through holes being provided between metal films configuring the wire circuit.

The ultraviolet ray transmitter may include a plurality of first through holes formed in the base film, and a plurality of second through holes formed in the base film and in corresponding locations in the solder resist in a thickness direction of the touch screen circuit film.

The first through holes may be formed in a part of the base film that is not covered by the solder resist, the first through holes and the second through holes being provided between metal films configuring the wire circuit.

The ultraviolet ray transmitter may include a plurality of transparent portions formed in the base film.

The transparent portions may be formed with resin that is disposed in a plurality of through holes formed in the base film, and the through holes may be formed in a part of the base film that is not covered by the solder resist, the through holes being provided between metal films configuring the wire circuit.

The ultraviolet ray transmitter may include a plurality of first transparent portions formed in the base film, and a plurality of second transparent portions formed in the base film and in corresponding locations in the solder resist in a thickness direction of the touch screen circuit film.

The first transparent portions may be formed with resin that is disposed in a plurality of first through holes formed in the base film, and the second transparent portions may be formed with resin that is disposed in a plurality of second through holes formed in the base film and the solder resist.

The first transparent portions may be formed in a part of the base film that is not covered by the solder resist, the first transparent portions and the second transparent portions being provided between metal films configuring the wire circuit.

The base film may have an ultraviolet ray transmittance that is about 50% or more, the ultraviolet ray transmitter being formed by an area of the base film that is not covered by the wire circuit and the solder resist.

The base film and the solder resist may have an ultraviolet ray transmittance that is about 50% or more, the ultraviolet ray transmitter being formed by an area of the base film and the solder resist that is not covered by the wire circuit.

The touch screen circuit film may includes a first ultraviolet ray transmitter, and the metal wire may include a second ultraviolet ray transmitter, the second ultraviolet ray transmitter including through holes formed in the metal wire.

The touch screen circuit film may include a first ultraviolet ray transmitter, and the metal wire may include a second ultraviolet ray transmitter, the metal wire having an ultraviolet ray transmittance that is about 50% or more.

The metal wire may include the ultraviolet ray transmitter, the ultraviolet ray transmitter including a plurality of through holes formed in the metal wire.

The metal wire may include the ultraviolet ray transmitter, the metal wire having an ultraviolet ray transmittance that is about 50% or more.

BRIEF DESCRIPTION OF THE DRAWINGS

Features will become apparent to those of skill in the art by describing in detail example embodiments with reference to the attached drawings in which.

DETAILED DESCRIPTION

Figure 1:
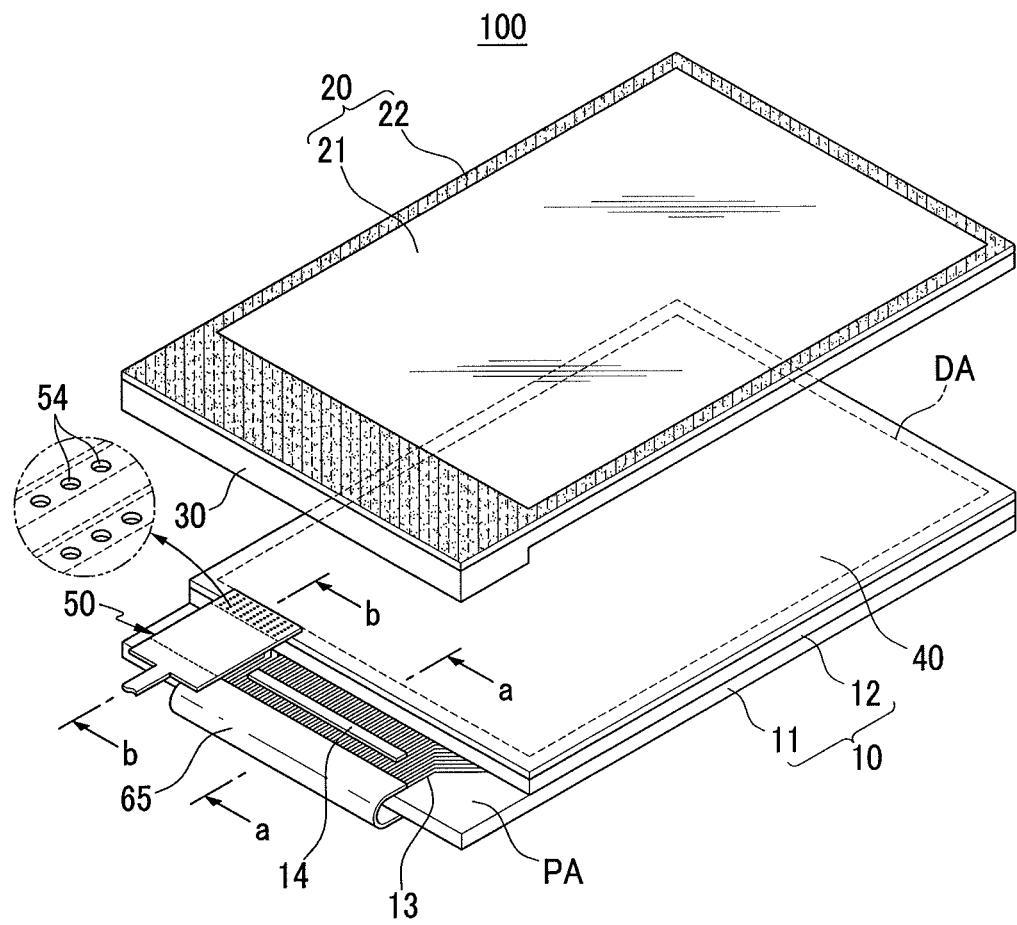
FIG. 1 shows an exploded perspective view of an organic light emitting diode (OLED) display according to a first example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "on" another element, it can be directly on the other element, or one or more intervening elements may also be present. It will also be understood that when an element is referred to as being "under" another element, it can be directly under, or one or more intervening elements may also be present. It will also be understood that when an element is referred to as being "between" two elements, it can be the only element between the two elements, or one or more intervening elements may also be present. When it is said that any part, such as a layer, film, region, or plate, is positioned on another part, it means the part is directly on the other part or above the other part with at least one intermediate part. In addition, an upper part of a target portion indicates an upper part or a lower part of a target portion, and it does not mean that the target portion is always positioned at the upper side based on a gravity direction. Like reference numerals refer to like elements throughout.

In the specification, unless explicitly described to the contrary, the word "comprise" and variations such as "comprises" or "comprising" will be understood to imply the inclusion of stated elements but not the exclusion of any other elements.

Figure 2:
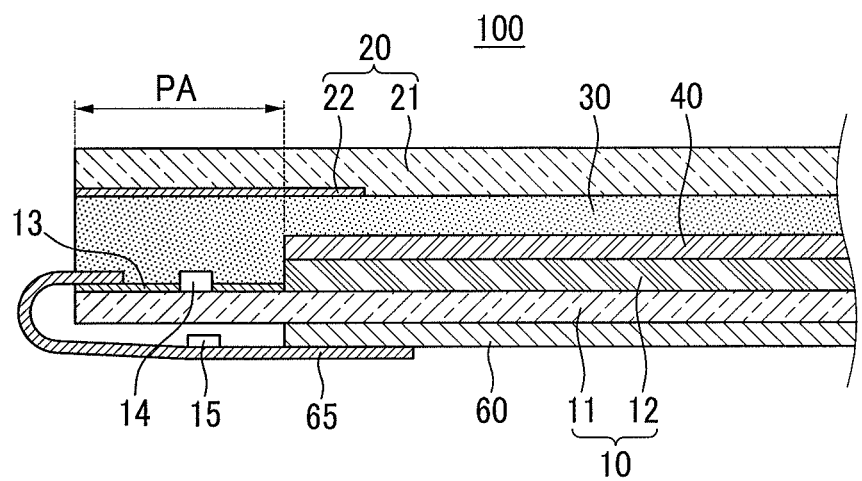
FIG. 2 shows a cross-sectional view of an organic light emitting diode (OLED) display according to a first example embodiment with respect to a line a-a of FIG. 1.
Figure 3:
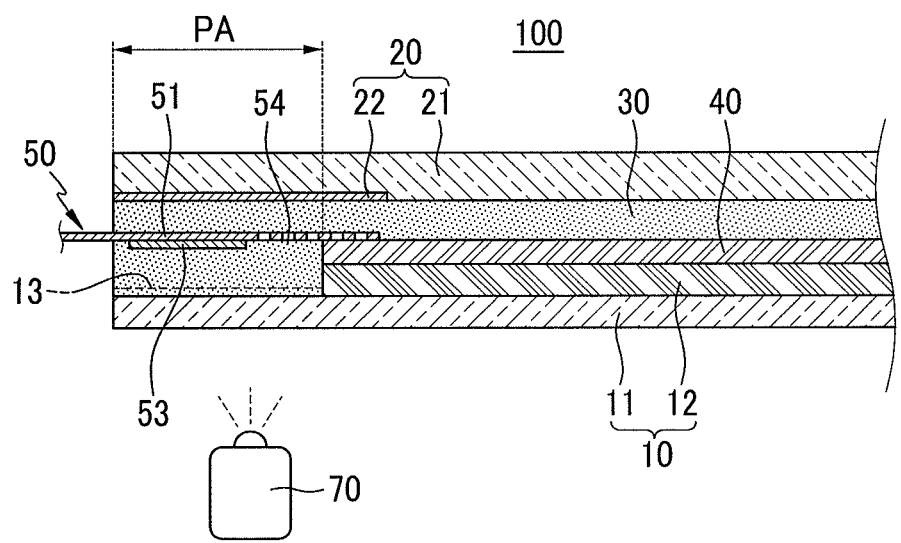
FIG. 3 shows a cross-sectional view of an organic light emitting diode (OLED) display according to a first example embodiment with respect to a line b-b of FIG. 1.

FIG. 1 shows an exploded perspective view of an organic light emitting diode (OLED) display according to a first example embodiment, and FIG. 2 and FIG. 3 show cross-sectional views of an organic light emitting diode (OLED) display according to a first example embodiment. FIG. 2 shows a cross section with respect to a line a-a of FIG. 1, and FIG. 3 shows a cross-section with respect to a line b-b of FIG. 1.

Referring to FIG. 1 to FIG. 3, the organic light emitting diode (OLED) display 100 according to first example embodiment includes a display panel 10 for displaying an image, a cover window 20 provided on an external side of a display side of the display panel 10, and a resin layer 30 provided between the display panel 10 and the cover window 20. Also, the organic light emitting diode (OLED) display 100 includes a touch screen panel 40 attached to a display side of the display panel 10, and a touch screen circuit film 50 connected to the touch screen panel 40.

The display panel 10 includes a substrate 11 including a display area (DA) and a pad area (PA), and an encapsulation substrate 12 bonded to the substrate 11. The substrate 11 and the encapsulation substrate 12 may be made of, e.g., glass or a polymer film. A plurality of signal lines (scan lines and data lines) and a plurality of pixels are provided in the display area (DA) of the substrate 11, and a plurality of metal wires 13 connected to a plurality of signal lines are provided in the pad area (PA).

The display panel 10 may include a scan driver and a data driver. The scan driver supplies a scan signal to the plurality of pixels through the scan lines, and the data driver supplies a data signal to the plurality of pixels through the data lines. The scan driver and/or the data driver may be provided in the pad area (PA) according to a chip on glass (COG) method. Reference numeral 14 in FIG. 1 and FIG. 2 indicates a first integrated circuit chip provided in the pad area (PA).

In the present example embodiment, the encapsulation substrate 12 is formed to be smaller than the substrate 11, and it is attached to the display area (DA) of the substrate 11. The substrate 11 and the encapsulation substrate 12 may be integrally bonded by a sealant (not shown) that is coated along an edge of the encapsulation substrate 12. The encapsulation substrate 12 may help seal the plurality of pixels to protect the pixels from external air including moisture and oxygen. A thin-film encapsulation layer in which at least one organic film and at least one inorganic film are alternately stacked may be provided, e.g., instead of the encapsulation substrate 12.

In the present example embodiment, the organic light emitting diode (OLED) display 100 includes a flexible printed circuit (FPC) 60 on which a control circuit for transmitting a control signal to the display panel 10 is formed, and a main circuit film 65 for connecting the display panel 10 with the flexible printed circuit (FPC) 60. The main circuit film 65 is attached to the pad area (PA) and is electrically connected to the metal wires 13, and it is bent to an opposite side of the display side of the display panel 10 so that the flexible printed circuit (FPC) 60 may be provided at the opposite side of the display panel 10.

The scan driver and/or the data driver may be provided at the main circuit film 65 according to a chip on film (COF) method. Reference numeral 15 in FIG. 2 represents a second integrated circuit chip provided in the main circuit film 65.

In the present example embodiment, the pixels provided on the substrate 11 emit light to the encapsulation substrate 12, and an external side of the encapsulation substrate 12 is the display side of the display panel 10. The touch screen panel 40 is attached to the external side of the encapsulation substrate 12 and is overlapped on the display area (DA), and the touch screen circuit film 50 is electrically connected to electrodes of the touch screen panel 40. The touch screen circuit film 50 is provided on a top of the pad area (PA).

In the present example embodiment, the cover window 20 is provided on the external side of the display side of the display panel 10 and protects the display panel 10 from external impacts and scratches. The cover window 20 is formed with a transparent material such as glass or transparent plastic, and it covers the encapsulation substrate 12 and the pad area (PA). The cover window 20 includes a light transmitter 21 corresponding to the display area (DA), and a light blocker 22 provided on an external side, e.g., at one or more edges, of the light transmitter 21. The light blocker 22 shields a part in which the image is not displayed by the display panel 10.

In the present example embodiment, the resin layer 30 is provided between the display panel 10 and the cover window 20, and it bonds the display panel 10 and the cover window 20. In an implementation, the resin layer 30 is formed to fill a space between the touch screen panel 40 and the cover window 20 and a space between the pad area (PA) and the cover window 20. When the resin layer 30 is formed to have the same area as the substrate 11 and fills the space between the display panel 10 and the cover window 20, the best bonding performance may be provided.

In the present example embodiment, the resin layer 30 includes an acryl-based resin that is hardened by the ultraviolet (UV) rays. The resin layer 30 is initially coated as a liquid or paste on the cover window 20, and it is hardened by the ultraviolet (UV) rays when the display panel 10 and the cover window 20 are stacked thereon. A lamp 70 (refer to FIG. 3) for irradiating the ultraviolet (UV) rays is provided to be opposite the display side of the display panel 10.

When a part fails to receive the ultraviolet (UV) rays while the resin layer 30 is hardened by using the ultraviolet (UV) rays, the resin layer may not be fully hardened and the material of the resin layer 30 that is not hardened may flow out of the pad area (PA). In this case, a cleansing process for removing the resin layer material outside the pad area (PA) may be performed. The organic light emitting diode (OLED) display 100 forms an ultraviolet (UV) ray transmitter on the touch screen circuit film 50 to increase a hardening degree of the resin layer 30.

Figure 4:
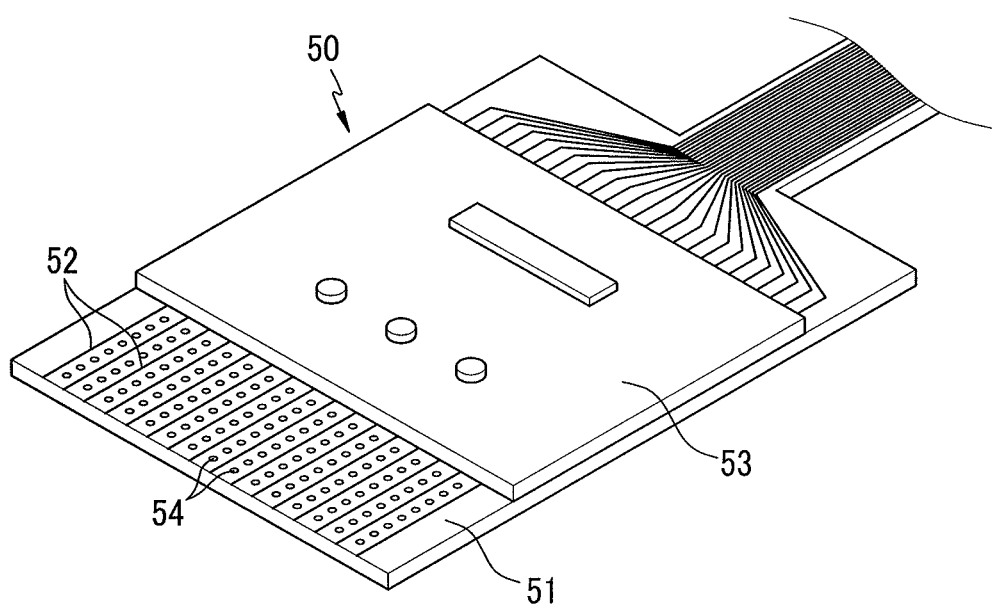
FIG. 4 shows a perspective view of a touch screen circuit film shown in FIG. 1.
Figure 5:
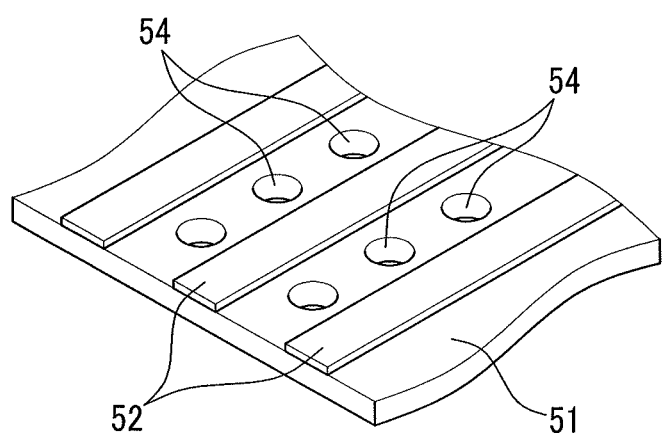
FIG. 5 shows a partially enlarged view of FIG. 4.

FIG. 4 shows a perspective view of a touch screen circuit film shown in FIG. 1, and FIG. 5 shows a partially enlarged view of FIG. 4. FIG. 4 shows that an upper side of the touch screen circuit film shown in FIG. 1 is disposed to face downward.

In the example embodiment shown in FIG. 3 to FIG. 5, the touch screen circuit film 50 includes a base film 51, a wire circuit 52 formed on one side of the base film 51, and a solder resist 53 for covering a part of the wire circuit 52. The base film 51 is formed with a polymer film such as polyimide. The wire circuit 52 is formed with a metal film such as copper (Cu), and it may be plated with tin (Sn) or gold (Au).

In the present example embodiment, the solder resist 53 is an insulating protective layer, it selectively exposes the wire circuit 52 to allow soldering with a component, and it controls wetness and diffusion of the soldering to protect the circuit from a short circuit. An end of the wire circuit 52 is not covered with the solder resist 53 but it is exposed and connected to an electrode of the touch screen panel 40.

In the present example embodiment, the ultraviolet (UV) ray transmitter includes a plurality of through holes 54 formed in the base film 51. The through holes 54 are formed in a part of the base film 51 that is not covered by the solder resist 53, and it is provided between the metal films configuring the wire circuit 52 so that the wire circuit 52 may not be short-circuited or disrupted.

The through holes 54 may be formed with various shapes such as circles or polygons, and they may be provided to be parallel with the metal films among the metal films configuring the wire circuit 52. FIG. 5 exemplifies a circular through hole 54, but the shape and disposal state of the through hole 54 are not restricted to the example and are changeable in various ways.

With the through holes 54 formed in the touch screen circuit film 50, the ultraviolet (UV) rays output by the lamp 70 pass through the through holes 54 and reach the resin layer 30. In the case of the first example embodiment, the ultraviolet (UV) rays output by the lamp 70 pass through the through holes 54 of the base film 51 and reach the resin layer 30. If the through holes 54 are not provided in the touch screen circuit film 50, most of the ultraviolet (UV) rays output by the lamp 70 may be intercepted by the touch screen circuit film 50 and may not reach the resin layer 30.

The amount of ultraviolet (UV) rays reaching the resin layer 30 may be increased so the organic light emitting diode (OLED) display 100 according to the first example embodiment increases the hardening degree of the resin layer 30 at the top of the touch screen circuit film 50. Thus, the hardening degree of the resin layer 30 may be increased in the pad area (PA) in which the touch screen circuit film 50 is provided. Therefore, when the resin layer 30 is hardened, the amount of the resin layer material that is not hardened in the pad area (PA) may be reduced to efficiently control the overflow of the resin layer material outside of the pad area (PA). As a result, the organic light emitting diode (OLED) display 100 may not need a process for cleansing the resin layer 30, thereby increasing process efficiency. Further, the organic light emitting diode (OLED) display 100 may not need an added component but may improve existing components to control the overflow of the resin layer 30. Therefore, a cost increase caused by manufacturing components may be avoided and an additional process for assembling the components may be avoided.

Figure 6:
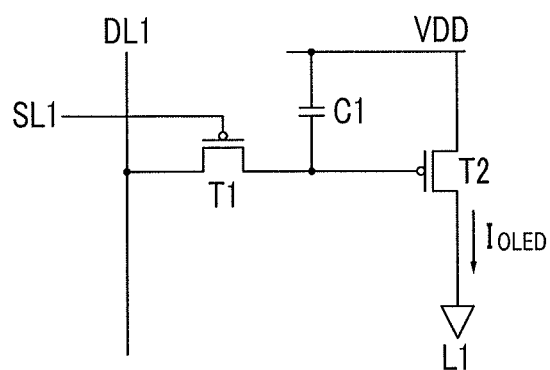
FIG. 6 shows a pixel circuit of a display panel shown in FIG. 1.
Figure 7:
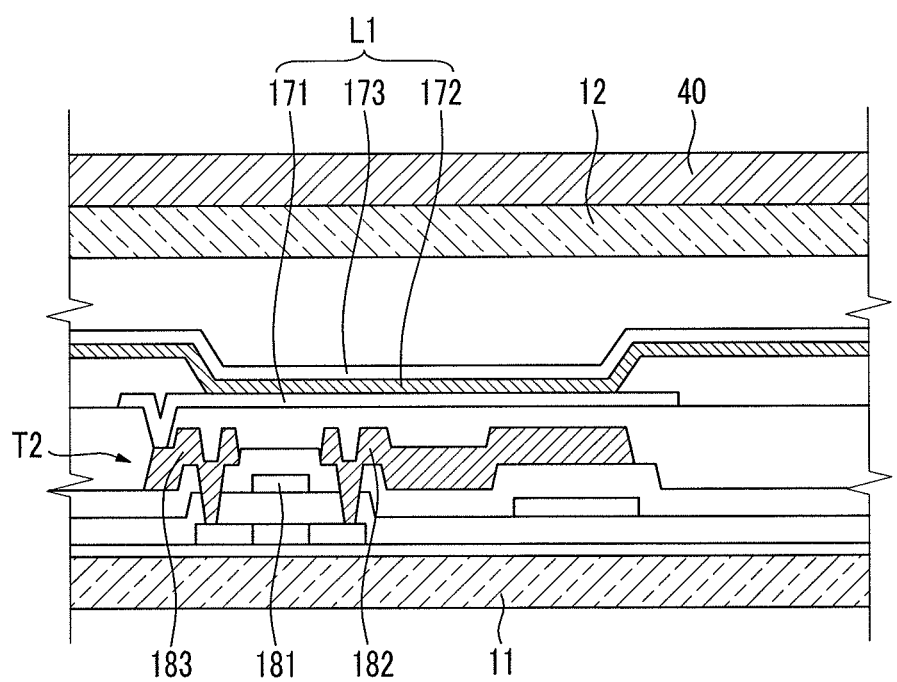
FIG. 7 shows a partially enlarged cross-sectional view of a display panel shown in FIG. 1.

FIG. 6 shows a pixel circuit of a display panel shown in FIG. 1, and FIG. 7 shows a partially enlarged cross-sectional view of a display panel shown in FIG. 1.

In the example embodiment shown in FIG. 6 and FIG. 7, a pixel includes an organic light emitting diode (OLED) L1 and a driving circuit T1, T2, and C1. The organic light emitting diode (OLED) L1 includes a pixel electrode 171, an organic emission layer 172, and a common electrode 173. The driving circuit T1, T2, and C1 includes two or more thin film transistors (a switching transistor T1 and a driving transistor T2) and one or more capacitors (capacitor C1).

One of the pixel electrode 171 and the common electrode 173 is an electron injection electrode and the other thereof is a hole injection electrode. When electrons and holes are injected into the organic emission layer 172, the electrons and holes are combined in the organic emission layer 172 to generate excitons, and the excitons output energy to emit light.

The switching transistor T1 is connected to the scan line SL1 and the data line DL1, and it transmits the data voltage that is input through the data line DL1 to the driving transistor T2 according to a switching voltage that is input to the scan line SL1. The capacitor C1 is connected to the switching transistor T1 and the power supply line VDD, and it stores a voltage that corresponds to a difference between the voltage supplied by the switching transistor T1 and the voltage supplied to the power supply line VDD.

The driving transistor T2 connected to the power supply line VDD and the capacitor C1 supplies an output current ($I_{OLED}$) that is proportional to a square of the difference between the voltage stored in the capacitor C1 and a threshold voltage to the organic light emitting diode (OLED) L1, and the organic light emitting diode (OLED) L1 emits light with intensity that is proportional to the output current ($I_{OLED}$).

The driving transistor T2 includes a gate electrode 181 and source/drain electrodes 182 and 183, and the pixel electrode 171 is connected to the drain electrode 183 of the driving transistor T2. The pixel electrode 171 is formed with a metal film that reflects light, and the common electrode 173 is formed with a transparent conductive layer through which light is transmitted. The light generated by the organic emission layer 172 is reflected by the pixel electrode 171, is transmitted through the common electrode 173 and the encapsulation substrate 12, and it is output to the outside of the display panel 10.

Figure 8:
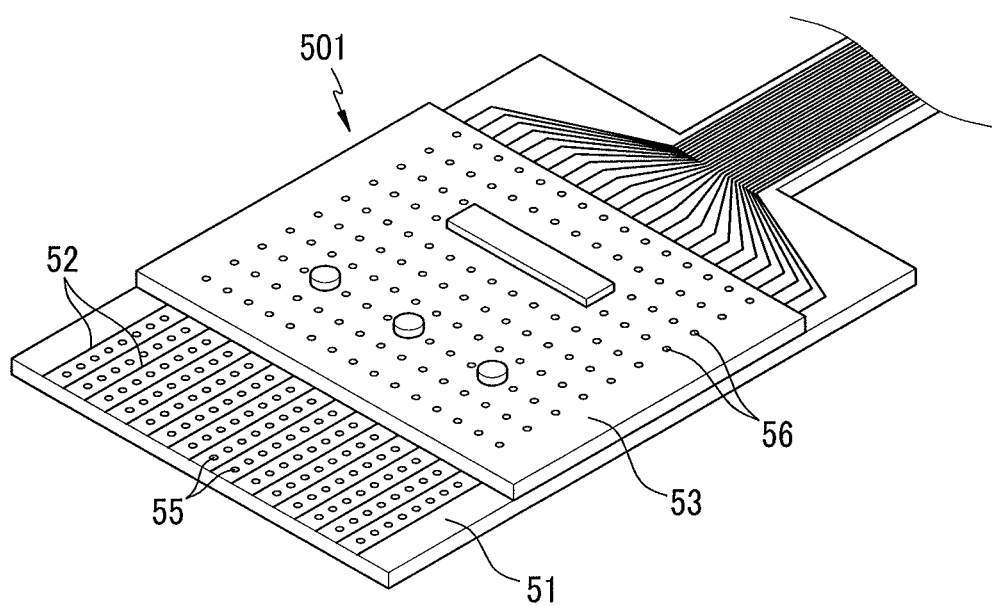
FIG. 8 shows a perspective view of a touch screen circuit film in an organic light emitting diode (OLED) display according to a second example embodiment.
Figure 9:
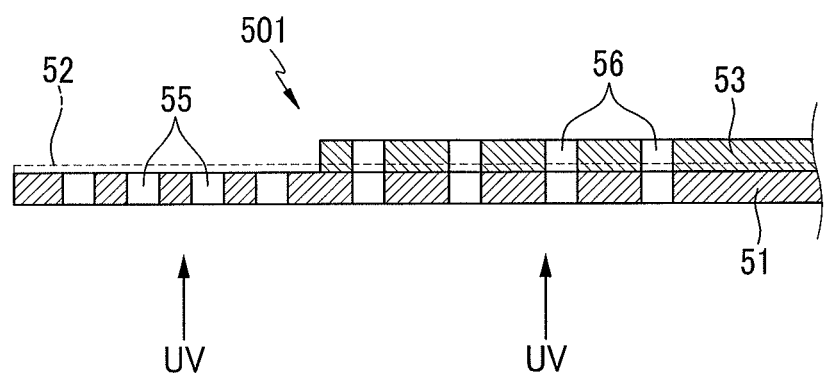
FIG. 9 shows a partially enlarged cross-sectional view of a touch screen circuit film shown in FIG. 8.

The cross-sectional configurations of the pixel circuit shown in FIG. 6 and the display panel shown in FIG. 7 are examples, and the organic light emitting diode (OLED) display 100 according to the first example embodiment is not restricted to the above-noted examples and is changeable in various ways FIG. 8 shows a perspective view of a touch screen circuit film in an organic light emitting diode (OLED) display according to a second example embodiment, and FIG. 9 shows a partially enlarged cross-sectional view of a touch screen circuit film shown in FIG. 8.

Referring to FIG. 8 and FIG. 9, in the organic light emitting diode (OLED) display according to the second example embodiment, the ultraviolet (UV) ray transmitter has the same configuration as in the organic light emitting diode (OLED) display according to the first example embodiment except for a plurality of first through holes 55 formed in the base film 51, a solder resist 53, and a plurality of second through holes 56 formed in the base film 51. The same members as in the first example embodiment will have the same reference numerals, and parts that are different from the first example embodiment will be described.

The first through holes 55 are formed in a part of the base film 51 that is not covered by the solder resist 53, and the second through holes 56 are formed to extend through both the solder resist 53 and the base film 51 in a thickness direction of a touch screen circuit film 501. The first through holes 55 and the second through holes 56 are provided between the metal films for forming the wire circuit 52 so that the wire circuit 52 may not be short-circuited or disrupted.

The first through holes 55 and the second through holes 56 are formed in the touch screen circuit film 501, and the ultraviolet (UV) rays that are output by the lamp 70 while the resin layer 30 is hardened transmit through the first through holes 55 and the second through holes 56 to reach the resin layer 30 at the top of the touch screen circuit film 501.

The touch screen circuit film 501 according to the second example embodiment forms a greater number of through holes than the first example embodiment so it can transmit a greater amount of ultraviolet (UV) rays to increase the hardening degree of the resin layer 30. Therefore, the overflow of the resin layer material outside the pad area (PA) may be more efficiently controlled by reducing the amount of the resin layer material that is not hardened in the pad area (PA).

Figure 10:
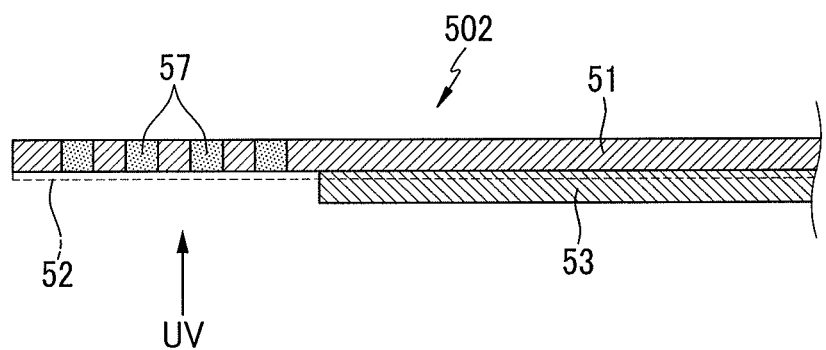
FIG. 10 shows an enlarged cross-sectional view of a touch screen circuit film of an organic light emitting diode (OLED) display according to a third example embodiment.

FIG. 10 shows an enlarged cross-sectional view of a touch screen circuit film of an organic light emitting diode (OLED) display according to a third example embodiment.

Referring to FIG. 10, the organic light emitting diode (OLED) display according to the third example embodiment has the same configuration as the organic light emitting diode (OLED) display according to the first example embodiment, except that the ultraviolet (UV) ray transmitter is configured with a plurality of transparent portions 57 formed in the base film 51. The same members as in the first example embodiment will have the same reference numerals, and parts that are different from the first example embodiment will now be described.

The transparent portions 57 are formed with transparent resin that is filled in the through hole formed in the base film 51. The transparent portions 57 are formed in a part of the base film 51 that is not covered with the solder resist 53, and are provided between the metal films configuring the wire circuit 52 so that the wire circuit 52 may not be short-circuited or disrupted.

The transparent portions 57 may be transparent to UV rays and may transmit the ultraviolet (UV) rays output by the lamp 70 while the resin layer 30 is hardened to thus increase the hardening degree of the resin layer 30. In an implementation, the transparent portions 57 may fill through holes formed in the base film 51, which may help avoid or reduce inflow of foreign particles during the process for manufacturing the touch screen circuit film 502 and the process for treating the same.

Figure 11:
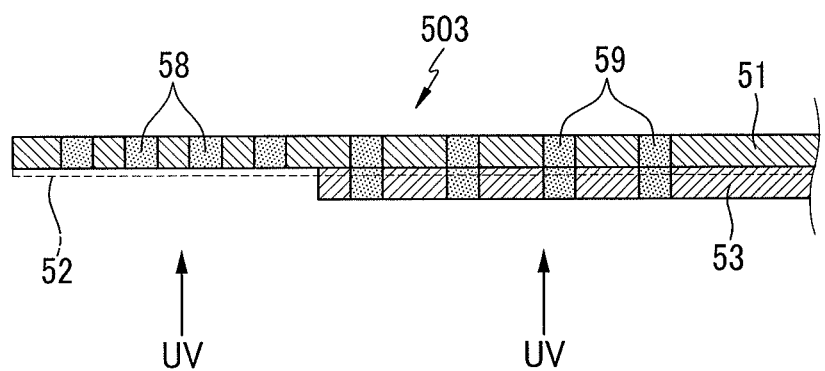
FIG. 11 shows an enlarged cross-sectional view of a touch screen circuit film in an organic light emitting diode (OLED) display according to a fourth example embodiment.

FIG. 11 shows an enlarged cross-sectional view of a touch screen circuit film in an organic light emitting diode (OLED) display according to a fourth example embodiment.

Referring to FIG. 11, the organic light emitting diode (OLED) display according to the fourth example embodiment has the same configuration as the organic light emitting diode (OLED) display according to the second example embodiment, except that the ultraviolet (UV) ray transmitter is configured with first transparent portions 58 formed in the base film 51, and second transparent portions 59 formed in the base film 51 and the solder resist 53. The same members as in the second example embodiment will have the same reference numerals, and parts that are different from the second example embodiment will now be described.

The first transparent portions 58 may be formed with transparent resin that is filled in first through holes formed in the base film 51. The second transparent portions 59 may be formed with transparent resin that is filled in second through holes formed through the solder resist 53 and the base film 51. The first transparent portions 58 and the second transparent portions 59 are provided between the metal films configuring the wire circuit 52 so that the wire circuit 52 may not be short-circuited or disrupted.

The first transparent portions 58 and the second transparent portions 59 transmit the ultraviolet (UV) rays output by the lamp 70 while the resin layer 30 is hardened to thus increase the hardening degree of the resin layer 30. The first transparent portions 58 and the second transparent portions 59 may fill the first through holes and the second through holes to reduce or avoid inflow of foreign particles during the process for manufacturing a touch screen circuit film 503 and the process for treating the same.

Figure 12:
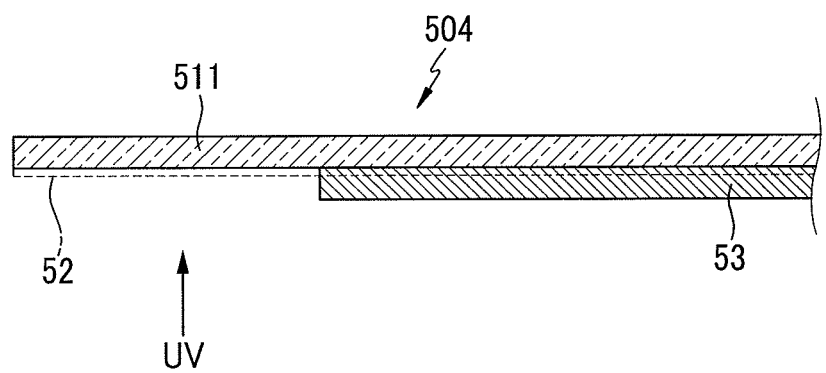
FIG. 12 shows an enlarged cross-sectional view of a touch screen circuit film in an organic light emitting diode (OLED) display according to a fifth example embodiment.

FIG. 12 shows an enlarged cross-sectional view of a touch screen circuit film 504 in an organic light emitting diode (OLED) display according to a fifth example embodiment.

Referring to FIG. 12, the organic light emitting diode (OLED) display according to the fifth example embodiment has the same configuration as the organic light emitting diode (OLED) display according to the first example embodiment, except that a base film 511 has ultraviolet (UV) ray transmittance of about 50% or more. The base film 511 may not be provided with through holes. The same members as in the first example embodiment will have the same reference numerals, and parts that are different from the first example embodiment will be described.

In the present example embodiment, the base film 511 is formed with a transparent material that has ultraviolet (UV) ray transmittance that is about 50% or more. For example, the base film 511 may include one or more of polyimide, polyethylene terephthalate, polycarbonate, epoxy, polyethylene, or polyacrylate as a basic component.

In the present example embodiment, the area of the base film 511 that is not covered with the wire circuit 52 and the solder resist 53 transmits the ultraviolet (UV) rays to function as an ultraviolet (UV) ray transmitter. Thus, in the organic light emitting diode (OLED) display according to the fifth example embodiment, the ultraviolet (UV) ray transmitter is formed with the area of the base film 511 that is not covered with the wire circuit 52 and the solder resist 53.

Figure 13:
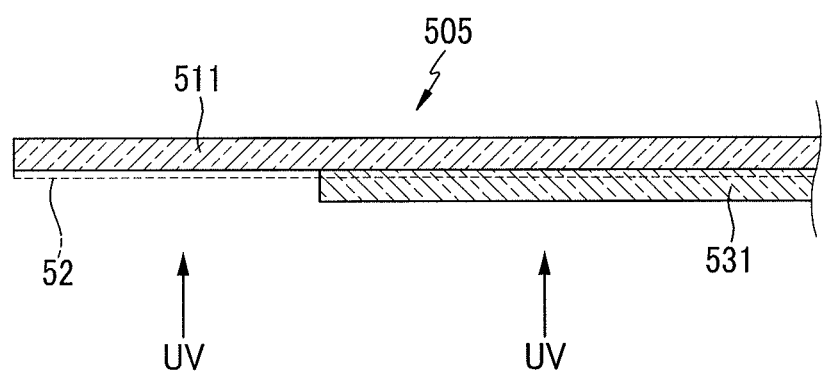
FIG. 13 shows an enlarged cross-sectional view of a touch screen circuit film in an organic light emitting diode (OLED) display according to a sixth example embodiment.

FIG. 13 shows an enlarged cross-sectional view of a touch screen circuit film in an organic light emitting diode (OLED) display according to a sixth example embodiment.

Referring to FIG. 13, the organic light emitting diode (OLED) display according to the sixth example embodiment has the same configuration as the organic light emitting diode (OLED) display according to the fifth example embodiment, except that the solder resist 531 has ultraviolet (UV) ray transmittance of about 50% or more together with the base film 511. The same members as in the fifth example embodiment have the same reference numerals, and parts that are different from the fifth example embodiment will be described.

The base film 511 and a solder resist 531 are formed with a transparent material having ultraviolet (UV) ray transmittance that is about 50% or more. Therefore, the area of a touch screen circuit film 505 in which the wire circuit 52 is not provided transmits the ultraviolet (UV) rays to function as an ultraviolet (UV) ray transmitter. Thus, in the organic light emitting diode (OLED) display according to the sixth example embodiment, the ultraviolet (UV) ray transmitter is formed with an area of the base film 511 and the solder resist 531 that is not overlapped with the wire circuit 52.

The ultraviolet (UV) ray transmitter according to the sixth example embodiment is wider than the ultraviolet (UV) ray transmitter according to the fifth example embodiment and may increase the amount of the ultraviolet (UV) rays reaching the resin layer 30 to thus increase the hardening degree of the resin layer 30.

Figure 14:
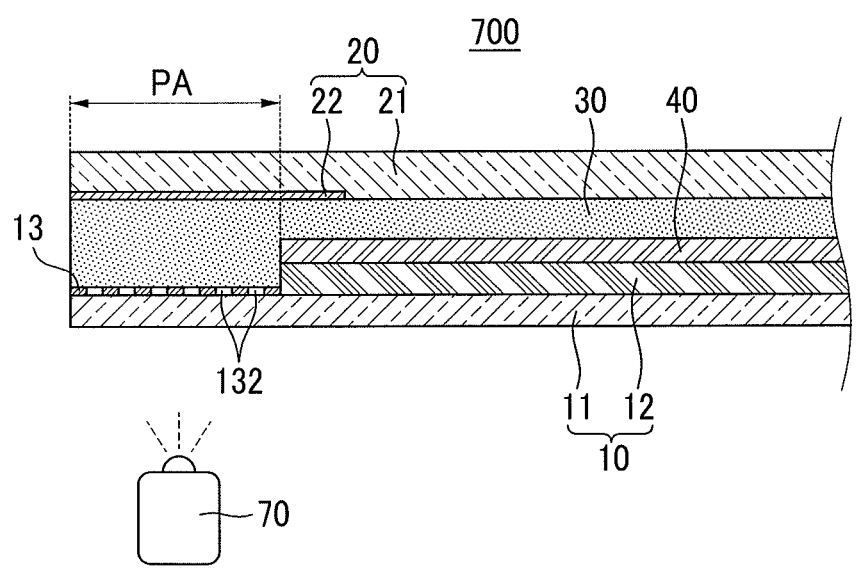
FIG. 14 shows a partial cross-sectional view of an organic light emitting diode (OLED) display according to a seventh example embodiment.
Figure 15A:
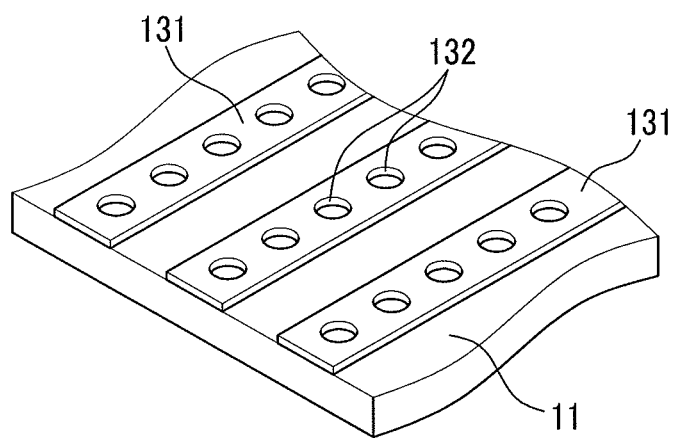
FIG. 15A and FIG. 15B show enlarged perspective views of a substrate and metal wires shown in FIG. 14.
Figure 15B:
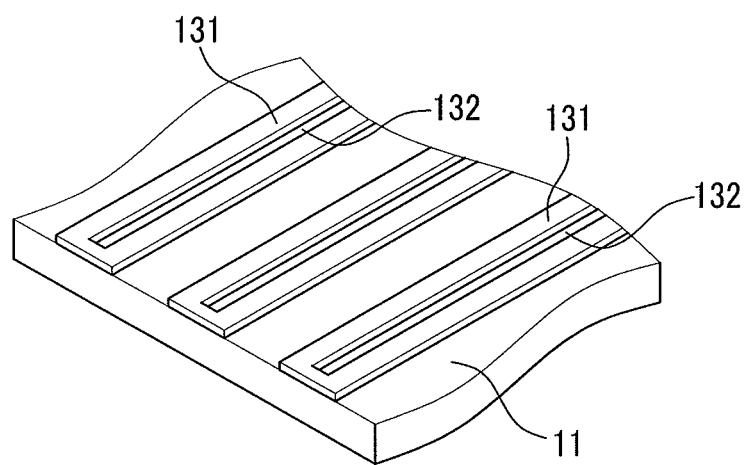

FIG. 14 shows a partial cross-sectional view of an organic light emitting diode (OLED) display according to a seventh example embodiment, and FIG. 15A and FIG. 15B show enlarged perspective views of a substrate and metal wires shown in FIG. 14.

Referring to FIG. 14, FIG. 15A, and FIG. 15B, in the organic light emitting diode (OLED) display 700 according to the seventh example embodiment, a ultraviolet (UV) ray transmitter is formed as a plurality of through holes 132 that are formed in metal wires 131. Except for this condition, the organic light emitting diode (OLED) display 700 according to the seventh example embodiment may have the same configuration as the organic light emitting diode (OLED) display according to the first example embodiment. The same members as in the first example embodiment have the same reference numerals and, although some parts described above may be omitted for clarity, it will be understood that parts described above in connection with other embodiments may be used in the present example embodiment. Parts that are different from the first example embodiment will now be described.

In the present example embodiment, the ultraviolet (UV) ray transmitter is formed with a plurality of through holes 132 that are formed in the metal wires 131. The through holes 132 formed in the metal wires 131 may be formed to be circular (as shown in FIG. 15A) or formed as slots extending in and parallel to the metal wires 131 (as shown in FIG. 15B). When the through holes 132 are circular, the through holes 132 may be provided to be parallel in a length direction of the metal wires 131. The through holes 132 may be formed to have other shapes as well as the circle or slot shapes.

In the present example embodiment, the metal wires 131 may have a relatively greater line resistance because of the through holes 132. In this case, line resistance of the metal wires 131 may be compensated or reduced by forming the metal wires 131 with a metallic material having excellent electrical conductivity or forming a plated layer with a metallic material having excellent electrical conductivity on the metal wires 131.

When the through holes 132 are formed in the metal wires 131, the ultraviolet (UV) rays output by the lamp 70 may be transmitted through the through holes 132 and reach the resin layer 30 at the top of the metal wires 131. In an implementation, the metal wires 131 may be spread over the pad area (PA) so the amount of the ultraviolet (UV) rays reaching the resin layer 30 from the pad area (PA) may be efficiently increased. Therefore, the overflow of the resin layer 30 may be more efficiently controlled by reducing the amount of the resin layer material that is not hardened in the pad area (PA).

Figure 16:
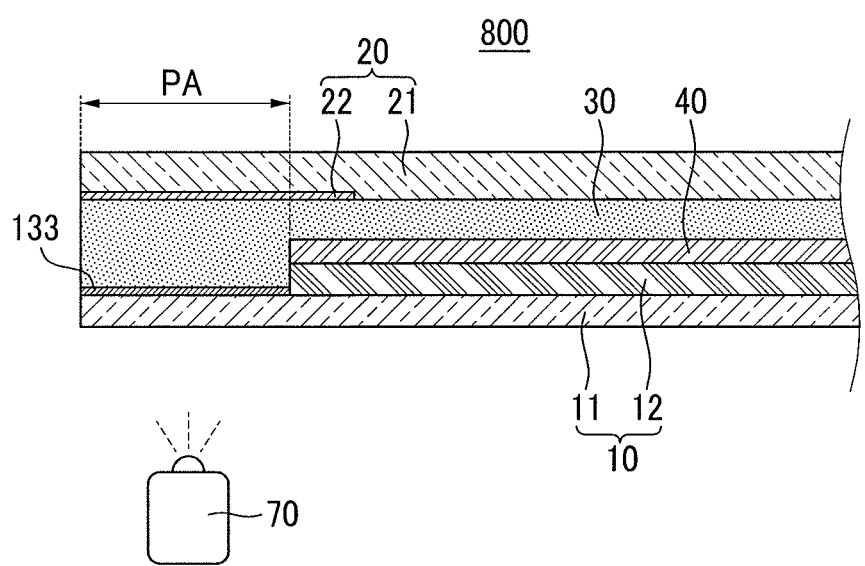
FIG. 16 shows a partial cross-sectional view of an organic light emitting diode (OLED) display according to an eighth example embodiment.

FIG. 16 shows a partial cross-sectional view of an organic light emitting diode (OLED) display according to an eighth example embodiment.

Referring to FIG. 16, in the organic light emitting diode (OLED) display 800 according to the eighth example embodiment, an ultraviolet (UV) ray transmitter is formed using a metal wire 133 that has ultraviolet (UV) ray transmittance that is about 50% or more. Except for this condition, the organic light emitting diode (OLED) display 800 according to the eighth example embodiment has the same configuration as the organic light emitting diode (OLED) display according to the first example embodiment. The same members as in the first example embodiment have the same reference numerals and, although some parts described above may be omitted for clarity, it will be understood that parts described above in connection with other embodiments may be used in the present example embodiment. Parts that are different from the first example embodiment will now be described.

In the present example embodiment, the metal wire 133 is formed with a conducting material that has transmittance that is about 50% or more for the ultraviolet (UV) rays. For example, the metal wire may include one or more of indium tin oxide (ITO), indium zinc oxide (IZO), or indium oxide ($In_2O_3$). The entire metal wire 133 that is not covered by the encapsulation substrate 12 and is exposed may be configured as the ultraviolet (UV) ray transmitter.

In the present example embodiment, the substrate 11 of the display panel 10 is formed with, e.g., a transparent glass or transparent polymer film and transmits most of the ultraviolet (UV) rays, and the metal wire 133 has ultraviolet (UV) ray transmittance that is about 50% or more. Accordingly, the amount of the ultraviolet (UV) rays reaching the resin layer 30 may be increased in the pad area (PA) to increase the hardening degree of the resin layer 30 and prevent overflowing.

In the first example embodiment to the sixth example embodiment, the ultraviolet (UV) ray transmitter is provided to the touch screen circuit films 50, 501, 502, 503, 504, and 505 to increase the hardening degree of the resin layer 30 provided at the top of the touch screen circuit films 50, 501, 502, 503, 504, and 505. In the seventh example embodiment and the eighth example embodiment, the ultraviolet (UV) ray transmitter is provided to the metal wires 131 and 133 to increase the hardening degree of the resin layer 30 provided at the top of the metal wires 131 and 133.

The ultraviolet (UV) ray transmitter can be provided to the touch screen circuit films 50, 501, 502, 503, 504, and 505 and the metal wires 131 and 133. In detail, the configuration of the ultraviolet (UV) ray transmitter according to the seventh or eighth example embodiment is applicable to the organic light emitting diode (OLED) display according to the first to sixth example embodiments. In this case, the amount of ultraviolet (UV) rays transmitted to the resin layer 30 at the top of the touch screen circuit films 50, 501, 502, 503, 504, and 505 and the metal wires 131 and 133 may be increased to increase the hardening degree of the resin layer 30 over a wider range in the pad area (PA).

By way of summation and review, an organic light emitting diode (OLED) display may include a display panel including an organic light emitting diode (OLED) and displaying an image, and a cover window provided on an external side of the display panel to protect the display panel. The display panel may include a pad area in which metal wires are exposed and to which a circuit film (e.g., a flexible print circuit film) is attached. A resin layer may be provided between the display panel and the cover window to bond the display panel and the cover window. The resin layer may be coated as a liquid on the cover window and the display panel may be stacked on the resin layer. The resin layer may then be hardened by ultraviolet (UV) rays. Various circuit films and metal wires that hinder transmission of ultraviolet (UV) rays may be present in the pad area. If the resin layer is not fully hardened in the pad area, it may flow from the pad area. In such a case additional processes or components, e.g., a cleansing process or a component for preventing overflow of the resin layer, may be needed.

As described above, embodiments relate to a method for controlling overflow of a resin layer during a process for hardening the resin layer. Embodiments may provide an organic light emitting diode (OLED) display configured to help prevent overflow of a resin layer by enabling ultraviolet (UV) ray curing and controlling flow of the resin layer when the resin layer is hardened. A touch screen circuit film and/or a metal wire may form an ultraviolet (UV) ray transmitter to increase a hardening degree of the resin layer in the pad area. Therefore, the amount of the material of the resin layer that is not hardened in the pad area may be reduced to help control overflow of the resin layer material and reduce or eliminate resin material that flows out of the pad area.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display, comprising:
    a display panel including a display area to which a touch screen panel is attached and a pad area in which a metal wire is formed;
    a cover window on one side of the display panel;
    a resin layer between the display panel and the cover window; and
    a touch screen circuit film in the pad area and connected to the touch screen panel, at least one of the touch screen circuit film and the metal wire including an ultraviolet ray transmitter configured to increase a hardening degree of the resin layer in the pad area.

2. The organic light emitting diode display as claimed in claim 1, wherein the touch screen circuit film includes a base film, a wire circuit on one side of the base film, and a solder resist covering a part of the wire circuit, the touch screen circuit film including the ultraviolet ray transmitter.

3. The organic light emitting diode display as claimed in claim 2, wherein the ultraviolet ray transmitter includes a plurality of through holes formed in the base film.

4. The organic light emitting diode display as claimed in claim 3, wherein the through holes are formed in a part of the base film that is not covered by the solder resist, the through holes being provided between metal films configuring the wire circuit.

5. The organic light emitting diode display as claimed in claim 2, wherein the ultraviolet ray transmitter includes a plurality of first through holes formed in the base film, and a plurality of second through holes formed in the base film and in corresponding locations in the solder resist in a thickness direction of the touch screen circuit film.

6. The organic light emitting diode display as claimed in claim 5, wherein the first through holes are formed in a part of the base film that is not covered by the solder resist, the first through holes and the second through holes being provided between metal films configuring the wire circuit.

7. The organic light emitting diode display as claimed in claim 2, wherein the ultraviolet ray transmitter includes a plurality of transparent portions formed in the base film.

8. The organic light emitting diode display as claimed in claim 7, wherein:
    the transparent portions are formed with resin that is disposed in a plurality of through holes formed in the base film, and
    the through holes are formed in a part of the base film that is not covered by the solder resist, the through holes being provided between metal films configuring the wire circuit.

9. The organic light emitting diode display as claimed in claim 2, wherein the ultraviolet ray transmitter includes a plurality of first transparent portions formed in the base film, and a plurality of second transparent portions formed in the base film and in corresponding locations in the solder resist in a thickness direction of the touch screen circuit film.

10. The organic light emitting diode display as claimed in claim 9, wherein:
    the first transparent portions are formed with resin that is disposed in a plurality of first through holes formed in the base film, and
    the second transparent portions are formed with resin that is disposed in a plurality of second through holes formed in the base film and the solder resist.

11. The organic light emitting diode display as claimed in claim 10, wherein the first transparent portions are formed in a part of the base film that is not covered by the solder resist, the first transparent portions and the second transparent portions being provided between metal films configuring the wire circuit.

12. The organic light emitting diode display as claimed in claim 2, wherein the base film has an ultraviolet ray transmittance that is about 50% or more, the ultraviolet ray transmitter being formed by an area of the base film that is not covered by the wire circuit and the solder resist.

13. The organic light emitting diode display as claimed in claim 2, wherein the base film and the solder resist have an ultraviolet ray transmittance that is about 50% or more, the ultraviolet ray transmitter being formed by an area of the base film and the solder resist that is not covered by the wire circuit.

14. The organic light emitting diode display as claimed in claim 2, wherein:
   the touch screen circuit film includes a first ultraviolet ray transmitter, and
   the metal wire includes a second ultraviolet ray transmitter, the second ultraviolet ray transmitter including through holes formed in the metal wire.

15. The organic light emitting diode display as claimed in claim 2, wherein:
   the touch screen circuit film includes a first ultraviolet ray transmitter, and
   the metal wire includes a second ultraviolet ray transmitter, the metal wire having an ultraviolet ray transmittance that is about 50% or more.

16. The organic light emitting diode display as claimed in claim 1, wherein the metal wire includes the ultraviolet ray transmitter, the ultraviolet ray transmitter including a plurality of through holes formed in the metal wire.

17. The organic light emitting diode display as claimed in claim 1, wherein the metal wire includes the ultraviolet ray transmitter, the metal wire having an ultraviolet ray transmittance that is about 50% or more.

* * * * *